(12) United States Patent
Sekino

(10) Patent No.: US 10,361,294 B2
(45) Date of Patent: Jul. 23, 2019

(54) SEMICONDUCTOR DEVICE

(71) Applicant: FUJI ELECTRIC CO., LTD., Kawasaki-shi, Kanagawa (JP)

(72) Inventor: Yusuke Sekino, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/721,843

(22) Filed: Sep. 30, 2017

(65) Prior Publication Data

US 2018/0122927 A1 May 3, 2018

(30) Foreign Application Priority Data

Nov. 2, 2016 (JP) .................................. 2016-214817

(51) Int. Cl.
*H01L 29/66* (2006.01)
*H01L 29/772* (2006.01)
(Continued)

(52) U.S. Cl.
CPC .......... *H01L 29/772* (2013.01); *H01L 23/053* (2013.01); *H01L 23/32* (2013.01); *H01L 23/49811* (2013.01); *H01L 24/73* (2013.01); *H01L 25/072* (2013.01); *H01L 25/18* (2013.01); *H01R 4/01* (2013.01); *H01L 23/367* (2013.01);
(Continued)

(58) Field of Classification Search
CPC ..... H01L 29/772; H01L 23/053; H01L 23/32; H01L 23/49811; H01L 23/367; H01L 24/73; H01L 24/29; H01L 24/32; H01L 25/072; H01L 25/18; H01L 2224/291; H01L 2224/32225; H01L 2224/48227; H01L 2924/01013; H01L 2924/01029;
(Continued)

(56) References Cited

U.S. PATENT DOCUMENTS

| | | | | |
|---|---|---|---|---|
| 6,741,085 B1* | 5/2004 | Khandros | ............ | B23K 1/0016 |
| | | | | 257/E21.503 |
| 2002/0050642 A1* | 5/2002 | Oota | ...................... | H01L 21/565 |
| | | | | 257/738 |

(Continued)

FOREIGN PATENT DOCUMENTS

| | | |
|---|---|---|
| JP | 2007-184315 A | 7/2007 |
| JP | 2009-064852 A | 3/2009 |
| JP | 2011-204622 A | 10/2011 |

*Primary Examiner* — Calvin Y Choi
(74) *Attorney, Agent, or Firm* — Rabin & Berdo, P.C.

(57) ABSTRACT

A semiconductor device includes a semiconductor element, a laminated substrate including an insulating board and a circuit board disposed on the insulating board, the semiconductor element being mounted on the circuit board, a surrounding case having an opening, and being disposed on the outer peripheral portion of the insulating board to surround the circuit board, a relay substrate having a through hole and being disposed on the surrounding case to cover the opening, and an external connection terminal including a first end portion bonded to the circuit board, a second end portion, opposite to the first end portion, inserted into the through hole of the relay substrate from the rear surface of the relay substrate so as to be in contact with the front surface of the relay substrate, and an elastically deformable elastic portion between the first end portion and the second end portion.

14 Claims, 7 Drawing Sheets

(51) Int. Cl.
*H01L 23/32* (2006.01)
*H01L 23/00* (2006.01)
*H01L 25/07* (2006.01)
*H01L 25/18* (2006.01)
*H01R 4/01* (2006.01)
*H01L 23/053* (2006.01)
*H01L 23/498* (2006.01)
*H01L 23/367* (2006.01)

(52) U.S. Cl.
CPC .............. *H01L 24/29* (2013.01); *H01L 24/32* (2013.01); *H01L 2224/291* (2013.01); *H01L 2224/32225* (2013.01); *H01L 2224/48227* (2013.01); *H01L 2924/01013* (2013.01); *H01L 2924/01029* (2013.01); *H01L 2924/1203* (2013.01); *H01L 2924/13055* (2013.01); *H01L 2924/13091* (2013.01); *H01L 2924/3511* (2013.01)

(58) Field of Classification Search
CPC ... H01L 2924/1203; H01L 2924/13055; H01L 2924/13091; H01L 2924/3511; H01R 4/01
USPC ........................................................ 257/197
See application file for complete search history.

(56) References Cited

U.S. PATENT DOCUMENTS

| | | | |
|---|---|---|---|
| 2007/0194429 A1* | 8/2007 | Lederer .................. | H01L 24/72 257/688 |
| 2008/0014767 A1* | 1/2008 | Oka ...................... | H01R 9/2425 439/76.2 |
| 2009/0320593 A1* | 12/2009 | Nakashio ........... | G01C 19/5663 73/504.15 |

* cited by examiner

SEMICONDUCTOR DEVICE

CROSS-REFERENCE TO RELATED APPLICATION

This application is based upon and claims the benefit of priority of the prior Japanese Patent Application No. 2016-214817, filed on Nov. 2, 2016, the entire contents of which are incorporated herein by reference.

BACKGROUND OF THE INVENTION

1. Field of the Invention

The embodiments discussed herein are related to a semiconductor device.

2. Background of the Related Art

A semiconductor device includes a laminated substrate including an insulating board, a circuit board formed over a front surface of the insulating board, and a metal plate formed over a back surface of the insulating board and a printed circuit board disposed opposite the laminated substrate. Furthermore, with the semiconductor device a semiconductor element and an external connection terminal are disposed over the circuit board of the laminated substrate. The external connection terminal is inserted into a through hole in the printed circuit board and is electrically connected to the printed circuit board. In addition, with the semiconductor device, the laminated substrate and the printed circuit board are housed in a case and the case is filled with a sealing member.

Japanese Laid-open Patent Publication No. 2009-064852

With the above semiconductor device, however, heat generated by the semiconductor element is conducted to the laminated substrate when the semiconductor element is driven. The difference in thermal expansion coefficient among the insulating board, the circuit board, and the metal plate causes a warp of the laminated substrate and the laminated substrate deforms. If the laminated substrate deforms, a thermal stress is applied to a portion at which the external connection terminal and the circuit board are bonded together and a portion at which the external connection terminal and the printed circuit board are bonded together. As a result, a bonding failure may occur, resulting in deterioration in the reliability of the semiconductor device.

SUMMARY OF THE INVENTION

According to an aspect, there is provided a semiconductor device including a semiconductor element; a laminated substrate including an insulating board, and a circuit board which is disposed over a front surface of the insulating board and over which the semiconductor element is mounted; a surrounding case which is disposed over an outer peripheral portion of the insulating board to surround the circuit board; a relay substrate having a back surface disposed over an edge portion of an opening of the surrounding case to cover the circuit board, and a through hole formed therein; and an external connection terminal having a first end portion bonded to the circuit board, a second end portion, opposite to the first end portion, inserted into the through hole from the back surface of the relay substrate so as to be in contact with a front surface of the relay substrate, and an elastically deformable elastic portion between the first end portion and the second end portion, the elastic portion extending toward both the first end portion and the second end portion.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described with reference to the accompanying drawings.

First Embodiment

Figure 1:
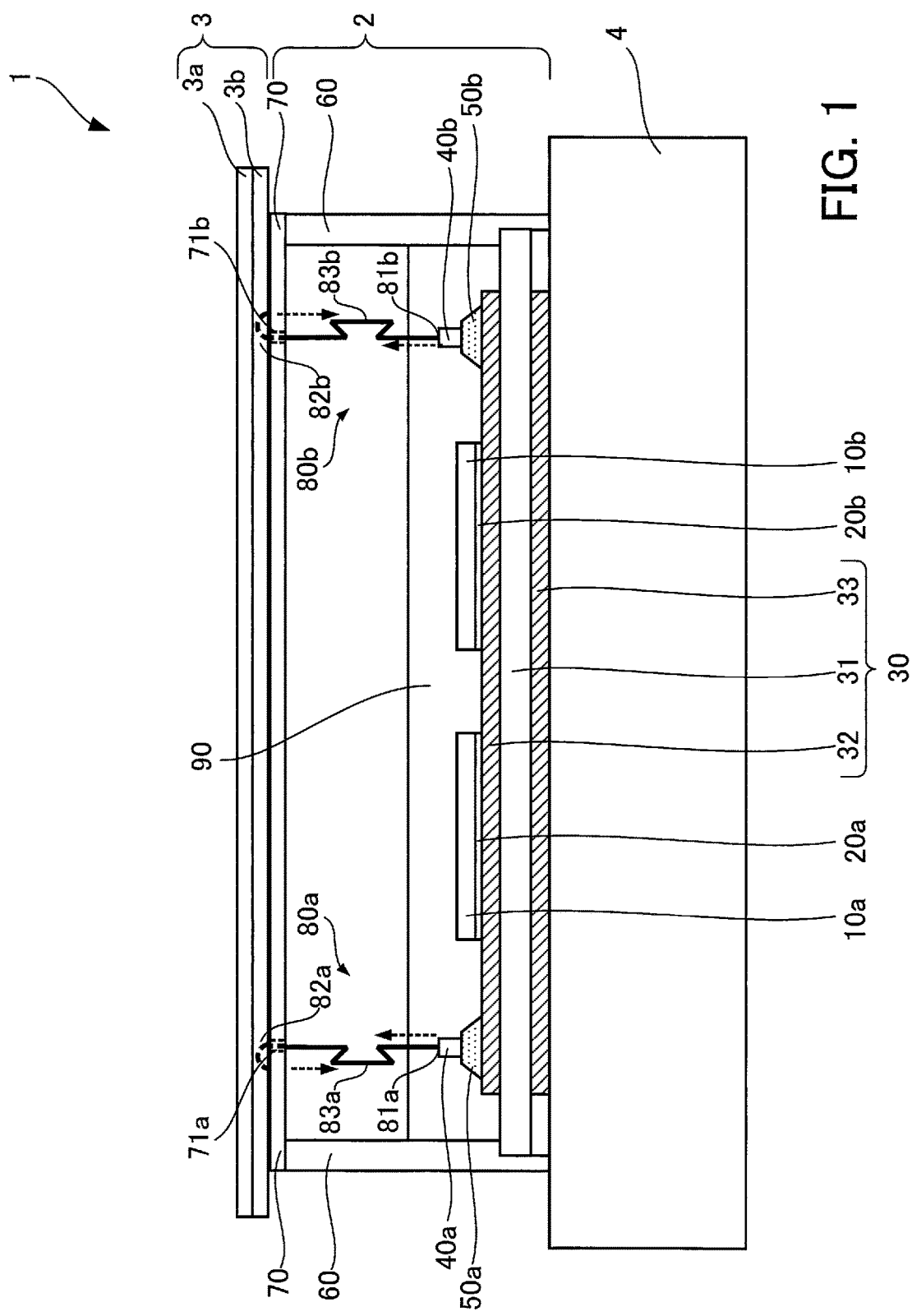
FIG. 1 illustrates a semiconductor device according to a first embodiment.

FIG. 1 illustrates a semiconductor device according to a first embodiment.

FIG. 1 is a side view of a semiconductor device 1.

Figure 2:
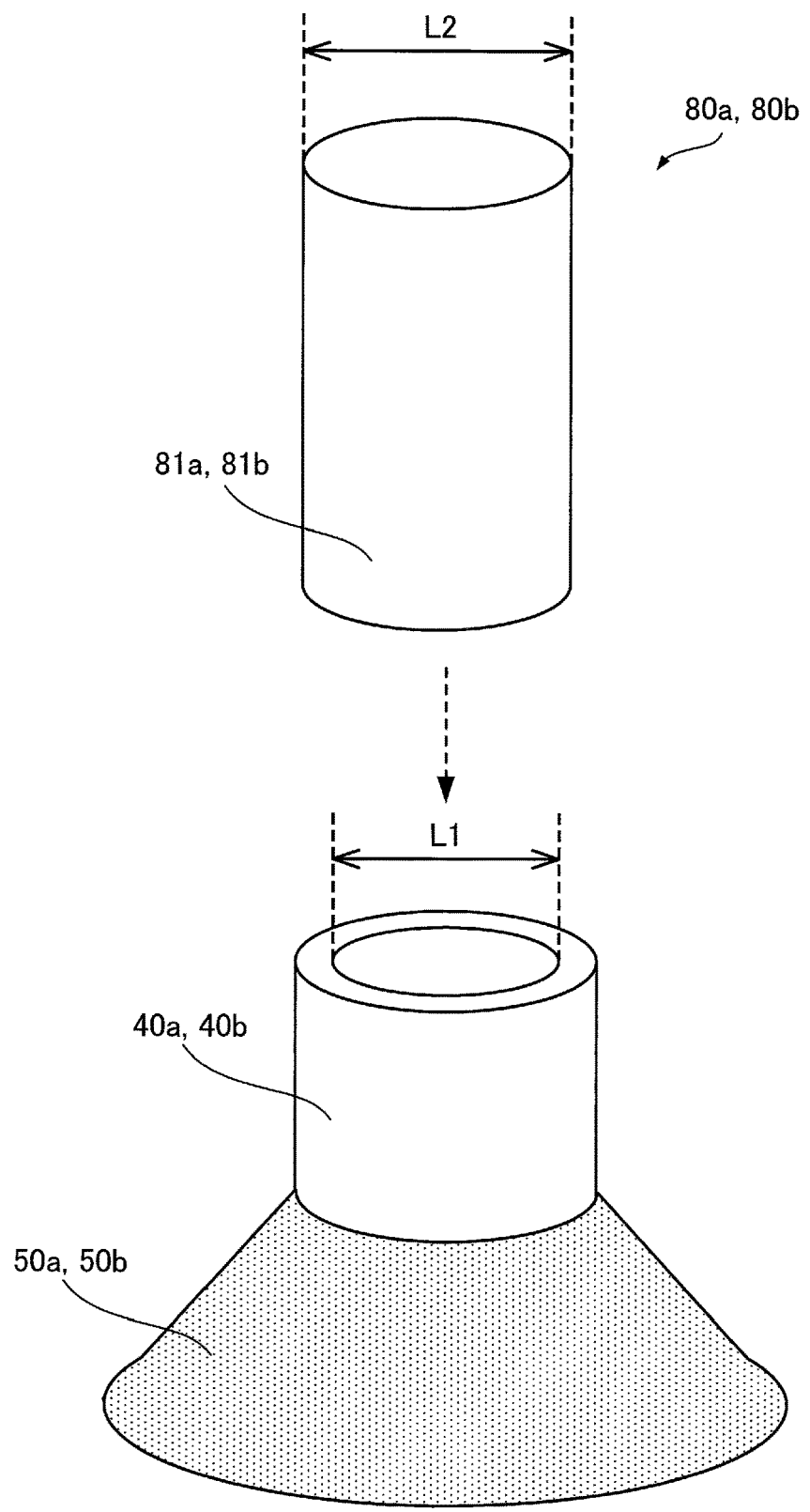
FIG. 2 illustrates bonding between terminals of the semiconductor device according to the first embodiment.

Furthermore, FIG. 2 illustrates bonding between terminals of the semiconductor device according to the first embodiment.

FIG. 2 is an enlarged view of joint terminals 40a and 40b of the semiconductor device 1.

The semiconductor device 1 includes a semiconductor module 2, a printed circuit board 3 fixed to a front surface of the semiconductor module 2, and a radiation plate 4 fixed to a back surface of the semiconductor module 2.

The semiconductor module 2 includes semiconductor elements 10a and 10b, a laminated substrate 30 over which the semiconductor elements 10a and 10b are disposed with solders 20a and 20b, respectively, therebetween, and a surrounding case 60 which surrounds the semiconductor elements 10a and 10b and the laminated substrate 30. The semiconductor module 2 includes a case lid portion 70 which is disposed over an edge portion of an opening of the surrounding case 60, which covers the semiconductor elements 10a and 10b, and over whose front surface the printed circuit board 3 is disposed and external connection terminals 80a and 80b one end portion of each of which is bonded to a front surface of the laminated substrate 30 and the other end portion of each of which is bonded to the case lid portion 70. With the above semiconductor module 2 the semiconductor elements 10a and 10b and the laminated substrate 30 in the surrounding case 60 are sealed with a sealing member 90.

Each of the semiconductor elements 10a and 10b is, for example, an insulated gate bipolar transistor (IGBT), a metal oxide semiconductor field effect transistor (MOSFET), or a freewheeling diode (FWD).

The laminated substrate 30 includes an insulating board 31, a circuit board 32 formed over a front surface of the insulating board 31, and a metal plate 33 formed over a back surface of the insulating board 31.

The insulating board 31 is formed of a material having electric insulation. Aluminum oxide, silicon nitride, or the like is used as such a material.

The circuit board 32 is formed of metal, such as copper, having good conductivity, and may include a plurality of circuit patterns (not illustrated). As illustrated in FIG. 1, in the first embodiment the semiconductor elements 10a and 10b are disposed over circuit patterns of the circuit board 32 with solders 20a and 20b, respectively, therebetween. The thickness of the above circuit board 32 is greater than or equal to 200 µm and smaller than or equal to 1000 µm and is preferably greater than or equal to 350 µm and smaller than or equal to 700 µm.

The metal plate 33 is disposed over the back surface of the insulating board 31 and is formed of aluminum, iron, silver, copper, an alloy containing these metals, or the like having high thermal conductivity. The thickness of the metal plate 33 is greater than or equal to 200 µm and smaller than or equal to 1000 µm and is preferably greater than or equal to 350 µm and smaller than or equal to 700 µm. The metal plate 33 may be thickened so as to also function as a radiation plate. In this case, the radiation plate 4 may be removed.

In addition, the joint terminals 40a and 40b are formed over circuit patterns of the circuit board 32 of the laminated substrate 30 with solders 50a and 50b, respectively, which are bonding materials therebetween.

The joint terminals 40a and 40b are formed of metal, such as copper, having good conductivity, and have, for example, a cylindrical shape as illustrated in FIG. 2. The diameter L1 of the joint terminals 40a and 40b is larger than or equal to 0.4 mm and smaller than or equal to 0.6 mm and is preferably larger than or equal to 0.45 mm and smaller than or equal to 0.55 mm. In the case of the first embodiment, the diameter L1 of the joint terminals 40a and 40b is, for example, about 0.5 mm. The shape of the joint terminals 40a and 40b is not limited to a cylindrical shape (round shape in section). The shape of the joint terminals 40a and 40b may be a square shape in section.

The surrounding case 60 has the shape of a frame and the shape of an approximately rectangular parallelepiped box. The surrounding case 60 is formed over an outer peripheral portion of the insulating board 31 of the laminated substrate 30 and surrounds the circuit board 32, the semiconductor elements 10a and 10b over the circuit board 32, and the joint terminals 40a and 40b. The above surrounding case 60 is formed of resin such as polyphenylene sulfide resin (PPS resin), polybutylene terephthalate resin (PBT resin), polyamide resin (PA resin), or acrylonitrile butadiene styrene resin (ABS resin).

A back surface of the case lid portion 70 is disposed over the edge portion of the opening of the surrounding case 60 so that the case lid portion 70 will cover the circuit board 32, the semiconductor elements 10a and 10b over the circuit board 32, and the joint terminals 40a and 40b. Through holes 71a and 71b are made in the case lid portion 70. The through holes 71a and 71b are formed so that when the case lid portion 70 is put over the edge portion of the opening of the surrounding case 60, the through holes 71a and 71b will be opposed to the joint terminals 40a and 40b respectively. Like the surrounding case 60, the case lid portion 70 is formed of resin such as polyphenylene sulfide resin, polybutylene terephthalate resin, polyamide resin, or acrylonitrile butadiene styrene resin. The case lid portion 70 is an example of a relay substrate.

The external connection terminals 80a and 80b are formed of metal, such as copper, having good conductivity. The external connection terminal 80a has an elastically deformable elastic portion 83a between one end portion 81a and the other end portion 82a. The external connection terminal 80b has an elastically deformable elastic portion 83b between one end portion 81b and the other end portion 82b. To be concrete, the external connection terminals 80a and 80b are formed of metal, such as copper, a copper alloy, aluminum, or an aluminum alloy. A copper alloy is phosphor bronze, nickel silver, beryllium copper, a copper-titanium alloy, a copper-nickel alloy, or the like. It is desirable to use as a copper alloy a copper-nickel alloy which is superior especially in tensile strength and electrical conductivity. Furthermore, in order to improve corrosion resistance and electrical properties, a nickel plating film, a gold plating film, a silver plating film, or a tin plating film may be formed as an external coating. Moreover, these plating films may be laminated. The elastic portions 83a and 83b are elastically deformable in a vertical direction in FIG. 1. The elastic portion 83a extends to the one end portion 81a side and the other end portion 82a side. The elastic portion 83b extends to the one end portion 81b side and the other end portion 82b side. As a result, the external connection terminals 80a and 80b pull the joint terminals 40a and 40b, respectively, and the case lid portion 70. The shape of the elastic portions 83a and 83b is not limited to that illustrated in FIG. 1. The elastic portions 83a and 83b may have any shape as long as they are elastically deformable in the vertical direction in FIG. 1. For example, the elastic portions 83a and 83b may have the shape of a spring, the letter "S," or the letter "U". Furthermore, the elastic modulus of the elastic portions 83a and 83b is higher than or equal to 2000 N/m$^2$ (Pa) and lower than or equal to 6000 N/m$^2$ and is preferably higher than or equal to 3000 N/m$^2$ and lower than or equal to 5000 N/m$^2$. The external connection terminals 80a and 80b have the shape of, for example, a cylinder or a flat plate. The external connection terminals 80a and 80b illustrated in FIG. 1 have the shape of a cylinder. The diameter L2 of the external connection terminals 80a and 80b is larger than or equal to 0.55 mm and smaller than or equal to 0.7 mm and is preferably larger than or equal to 0.6 mm and smaller than or equal to 0.65 mm. In the case of the first embodiment, as illustrated in FIG. 2, the diameter L2 is, for example, about 0.64 mm.

In addition, as stated above, the diameter L2 of the external connection terminals 80a and 80b is larger than the diameter L1 of the joint terminals 40a and 40b. Therefore, as illustrated in FIG. 2, the one end portion 81a of the external connection terminal 80a and the one end portion 81b of the external connection terminal 80b are inserted into the joint terminals 40a and 40b, respectively, by press-fitting.

On the other hand, the other end portion 82a of the external connection terminal 80a and the other end portion 82b of the external connection terminal 80b enter the through holes 71a and 71b, respectively, through the back surface of the case lid portion 70 and are in contact with a front surface of the case lid portion 70. The other end portion 82a of the external connection terminal 80a and the other end portion 82b of the external connection terminal 80b are exposed in this way from the front surface of the case lid portion 70 and are electrically connected to circuit patterns (not illustrated) of the printed circuit board 3 disposed over the front surface of the case lid portion 70. The details of the other end portion 82a of the external connection terminal 80a and the other end portion 82b of the external connection terminal 80b will be described later.

In the case of FIG. 1, the above external connection terminals 80a and 80b are disposed in two positions. However, the number of external connection terminals is not limited to two. External connection terminals are disposed in determined positions over the circuit board 32 of the laminated substrate 30.

The sealing member 90 is a heat-hardening resin such as epoxy resin, maleimide-modified epoxy resin, maleimide-modified phenolic resin, or maleimide resin. Furthermore, resin, such as silicone gel, may be used as the sealing member 90. In particular, if the sealing member 90 is a heat-hardening resin such as epoxy resin, then sealing is performed, as illustrated in FIG. 1, by the use of the sealing member 90 from a front surface of the circuit board 32 to which the one end portion 81a of the external connection terminal 80a and the one end portion 81b of the external connection terminal 80b are bonded to this side of a lower end on the one end portion 81a side of the elastic portion 83a and this side of a lower end on the one end portion 81b side of the elastic portion 83b in the surrounding case 60. That is to say, the elastic portions 83a and 83b are not sealed with the sealing member 90. If all the inside of the surrounding case 60 is sealed with the sealing member 90, the elastic portions 83a and 83b of the external connection terminals 80a and 80b, respectively, are also sealed. As a result, the elastic portions 83a and 83b do not expand or contract. To be concrete, if a sealing member whose elastic modulus is greater than 1000 MPa is used, then it is desirable to perform sealing to the underside of the elastic portions 83a and 83b of the external connection terminals 80a and 80b respectively.

It is assumed that the sealing member 90 is a gelatinous resin such as silicone gel. Even if all the inside of the surrounding case 60 is sealed with the sealing member 90, the elastic portions 83a and 83b of the external connection terminals 80a and 80b, respectively, are allowed to a certain extent to expand and contract. To be concrete, the elastic modulus of the sealing member 90 is smaller than or equal to 1000 MPa and is preferably smaller than or equal to 100 MPa.

Furthermore, the following method may be adopted. A heat-hardening resin, such as epoxy resin, maleimide-modified epoxy resin, maleimide-modified phenolic resin, or maleimide resin, is disposed as the sealing member 90 to the underside of the elastic portions 83a and 83b of the external connection terminals 80a and 80b, respectively, and an area in the surrounding case 60 over the heat-hardening resin is sealed with resin such as silicone gel.

In addition, the printed circuit board 3 includes an insulating layer 3a and a conductive layer 3b which is formed over a front surface of the insulating layer 3a and over which a circuit pattern for realizing determined wirings is formed.

The insulating layer 3a is formed of polyimide resin, epoxy resin, or the like. Furthermore, if circumstances require, the insulating layer 3a may be impregnated with a glass cloth made of glass fiber.

The conductive layer 3b is formed of metal, such as copper, having good conductivity.

The above printed circuit board 3 is disposed over the front surface of the case lid portion 70 with the conductive layer 3b on the side of the front surface of the case lid portion 70. The conductive layer 3b of the printed circuit board 3 is electrically connected to the other end portion 82a of the external connection terminal 80a and the other end portion 82b of the external connection terminal 80b which enter through the through holes 71a and 71b, respectively, of the case lid portion 70.

The radiation plate 4 is formed of aluminum, iron, silver, copper, an alloy containing these metals, or the like having high thermal conductivity. The metal plate 33 of the laminated substrate 30 of the semiconductor module 2 is disposed over a front surface of the radiation plate 4 with a solder (not illustrated) therebetween. A radiation fin or a liquid cooling cooler may be used in place of the radiation plate 4.

A method for fabricating the above semiconductor device 1 will now be described by the use of FIG. 1 and FIGS. 3 through 5.

Figure 3:
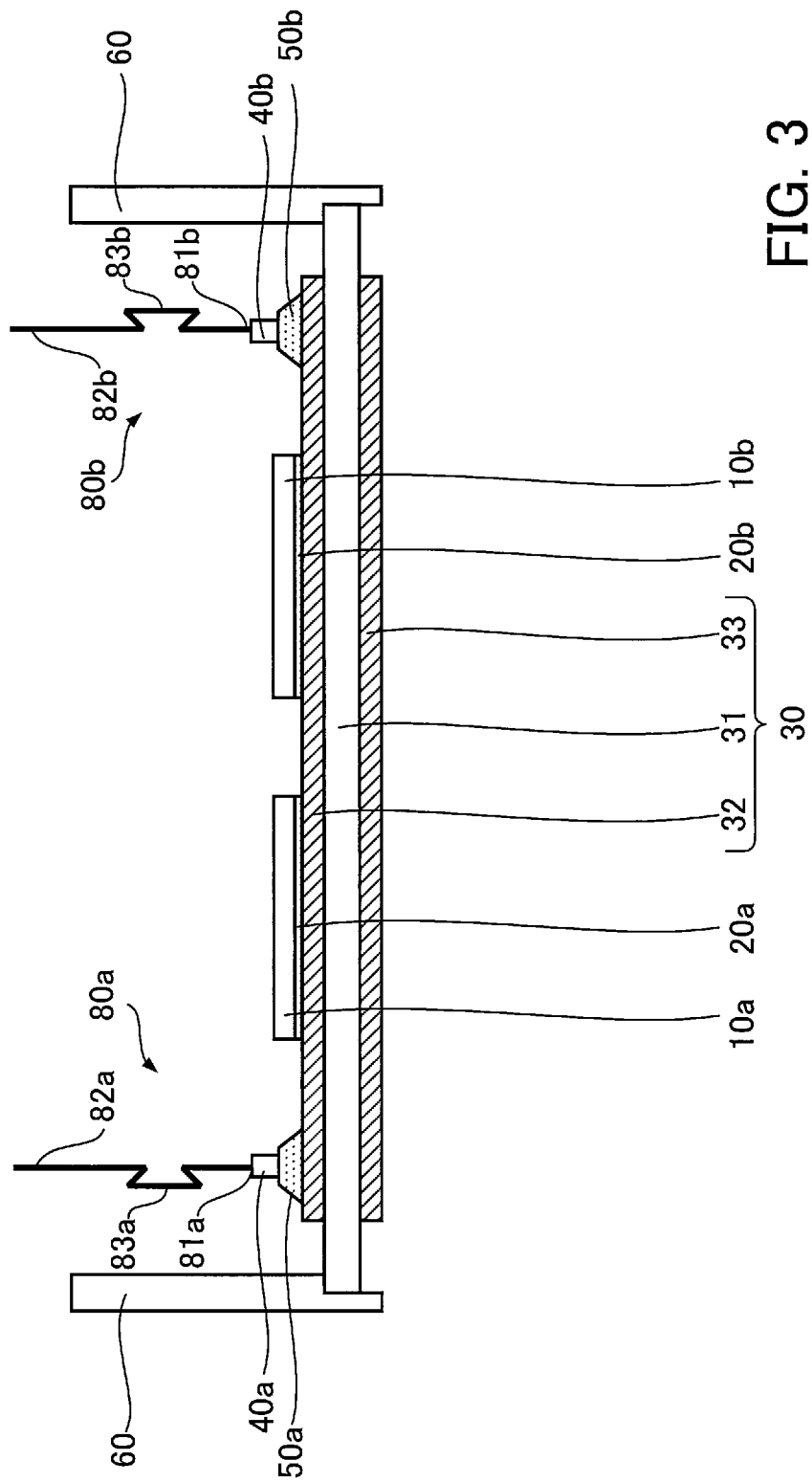
FIG. 3 illustrates a process for fabricating the semiconductor device according to the first embodiment (part 1)
Figure 4:
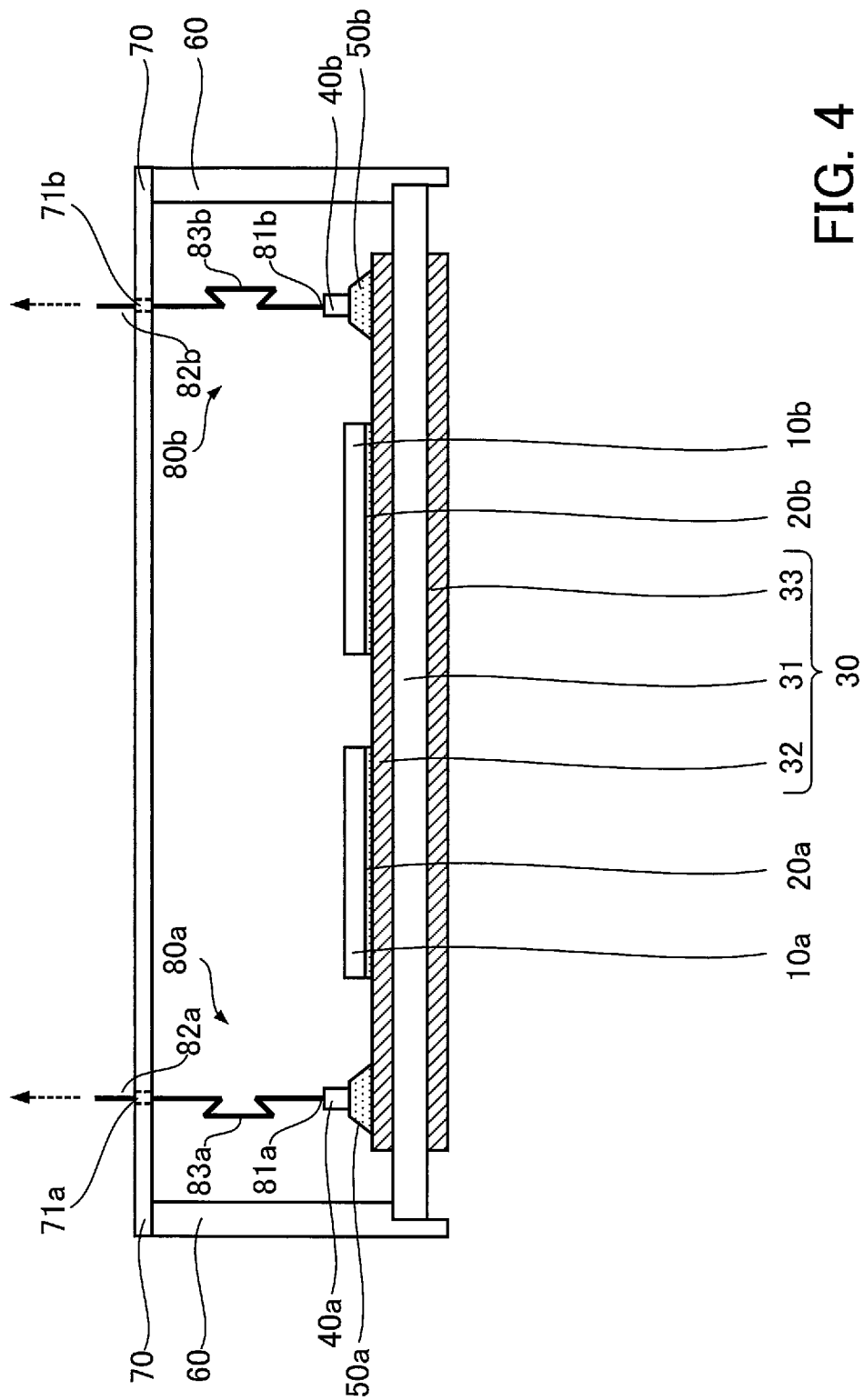
FIG. 4 illustrates a process for fabricating the semiconductor device according to the first embodiment (part 2)
Figure 5:
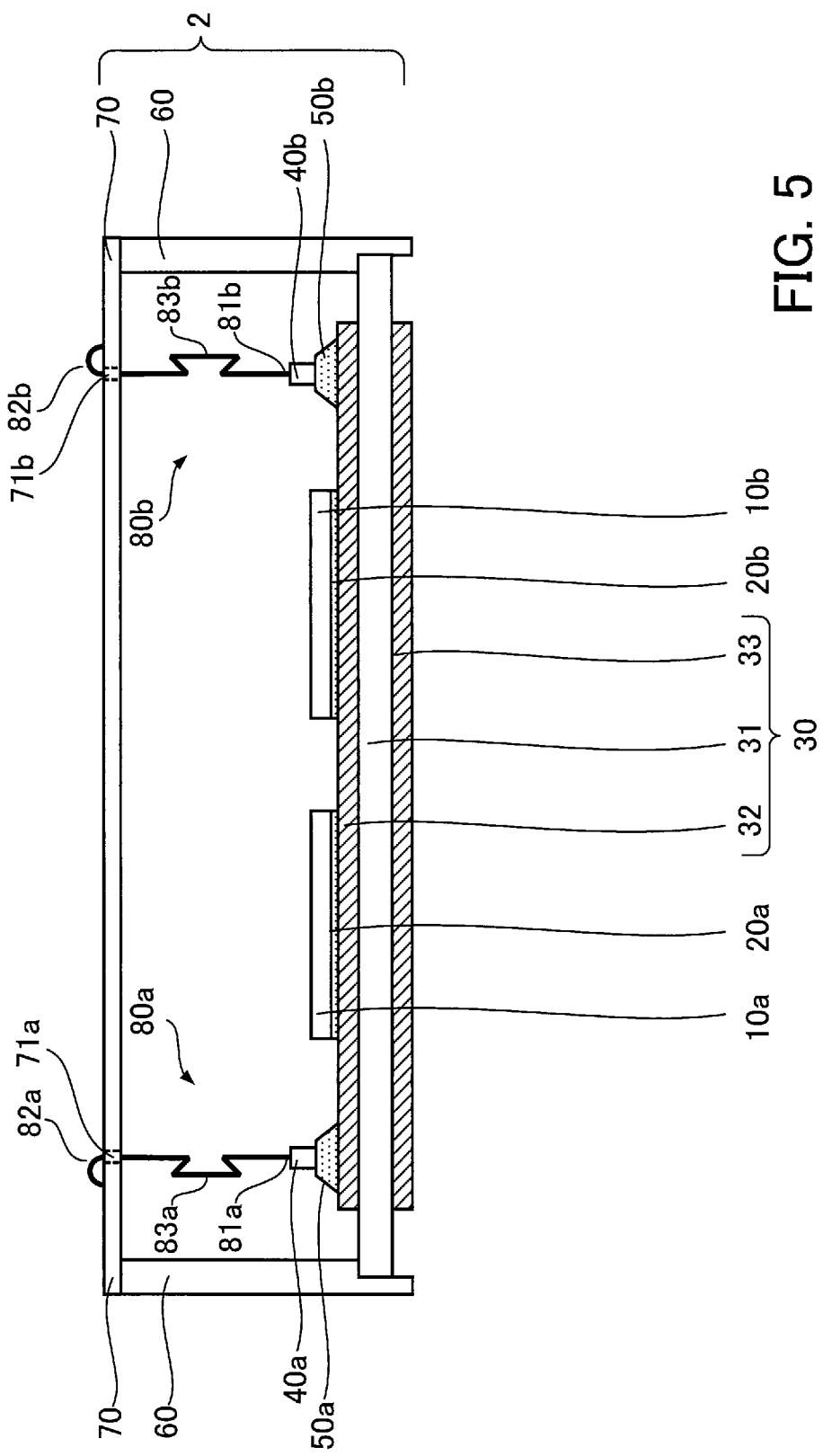
FIG. 5 illustrates a process for fabricating the semiconductor device according to the first embodiment (part 3)

FIGS. 3 through 5 illustrate a process for fabricating the semiconductor device according to the first embodiment.

First the semiconductor elements 10a and 10b, the laminated substrate 30, the joint terminals 40a and 40b, the surrounding case 60, the case lid portion 70, and the external connection terminals 80a and 80b are prepared. Furthermore, the printed circuit board 3 and the radiation plate 4 are prepared.

The semiconductor elements 10a and 10b are then disposed over determined areas of the circuit board 32 of the laminated substrate 30 with the solders 20a and 20b, respectively, therebetween. In addition, the joint terminals 40a and 40b are disposed over determined bonding areas of the circuit board 32 of the laminated substrate 30 with the solders 50a and 50b, respectively, therebetween.

The one end portion 81a of the external connection terminal 80a including the elastic portion 83a and the one end portion 81b of the external connection terminal 80b including the elastic portion 83b are then inserted by press-fitting into the joint terminals 40a and 40b, respectively, disposed over the laminated substrate 30.

As illustrated in FIG. 3, the surrounding case 60 is put over an outer peripheral portion of the insulating board 31 of the laminated substrate 30 over which the semiconductor elements 10a and 10b, the joint terminals 40a and 40b, and the external connection terminals 80a and 80b are disposed in this way with an adhesive (not illustrated) therebetween.

The other end portion 82a of the external connection terminal 80a and the other end portion 82b of the external connection terminal 80b are then inserted into the through holes 71a and 71b, respectively, in the case lid portion 70 to dispose the case lid portion 70 over the edge portion of the opening of the surrounding case 60 with an adhesive (not illustrated) therebetween. The through holes 71a and 71b of the case lid portion 70 disposed in this way are opposed to the joint terminals 40a and 40b respectively.

As illustrated in FIG. 4, the other end portion 82a of the external connection terminal 80a and the other end portion 82b of the external connection terminal 80b inserted into the through holes 71a and 71b, respectively, in the case lid portion 70 are pulled upward in FIG. 4 by, for example, 0.5 mm or more and 5 mm or less, preferably by 1 mm or more and 2 mm or less.

As illustrated in FIG. 5, in a state in which the other end portion 82a of the external connection terminal 80a and the other end portion 82b of the external connection terminal 80b are pulled up, the other end portion 82a and the other end portion 82b are then bent to the front surface of the case lid portion 70 so as to be hook-shaped and in contact with the front surface of the case lid portion 70. That is to say, a state in which the front surface of the case lid portion 70 catches the hook-shaped other end portion 82a and other end portion 82b arises. As a result, the elastic portions 83a and 83b of the external connection terminals 80a and 80b, respectively, are kept in an expanded state. Therefore, the case lid portion 70 is pressed downward in FIG. 5 by the other end portion 82a of the external connection terminal 80a and the other end portion 82b of the external connection terminal 80b.

The shape of the other end portion 82a of the external connection terminal 80a and the other end portion 82b of the external connection terminal 80b is not limited to the shape of a hook. As long as the front surface of the case lid portion 70 catches the other end portion 82a and the other end portion 82b, the other end portion 82a and the other end portion 82b may have any shape. For example, in a state in which the other end portion 82a of the external connection terminal 80a and the other end portion 82b of the external connection terminal 80b are pulled up from the through holes 71a and 71b respectively, the other end portion 82a and the other end portion 82b may be bent perpendicularly to a direction in which they are pulled up so as to have the shape of the letter "L".

The sealing member 90 is injected from an opening portion formed in the case lid portion 70 to fill the surrounding case 60 with the sealing member 90 to the underside of the elastic portions 83a and 83b of the external connection terminals 80a and 80b respectively. After that, heating is performed to harden the sealing member 90.

The surrounding case 60 may be filled with the sealing member 90 before the case lid portion 70 is disposed over the edge portion of the opening of the surrounding case 60 with the adhesive (not illustrated) therebetween.

As a result, the semiconductor module 2 is formed.

The printed circuit board 3 is then disposed over the case lid portion 70 of the semiconductor module 2 so that the conductive layer 3b will be in contact with the other end portion 82a of the external connection terminal 80a and the other end portion 82b of the external connection terminal 80b exposed from the case lid portion 70.

The radiation plate 4 is disposed over the metal plate 33 of the laminated substrate 30 of the semiconductor module 2 with the solder (not illustrated) therebetween.

The disposition of the radiation plate 4 may precede the disposition of the printed circuit board 3.

The semiconductor device 1 illustrated in FIG. 1 is obtained by the above process.

A semiconductor device (semiconductor module) taken as an example for reference relative to the semiconductor device 1 will now be described by the use of FIG. 6.

Figure 6:
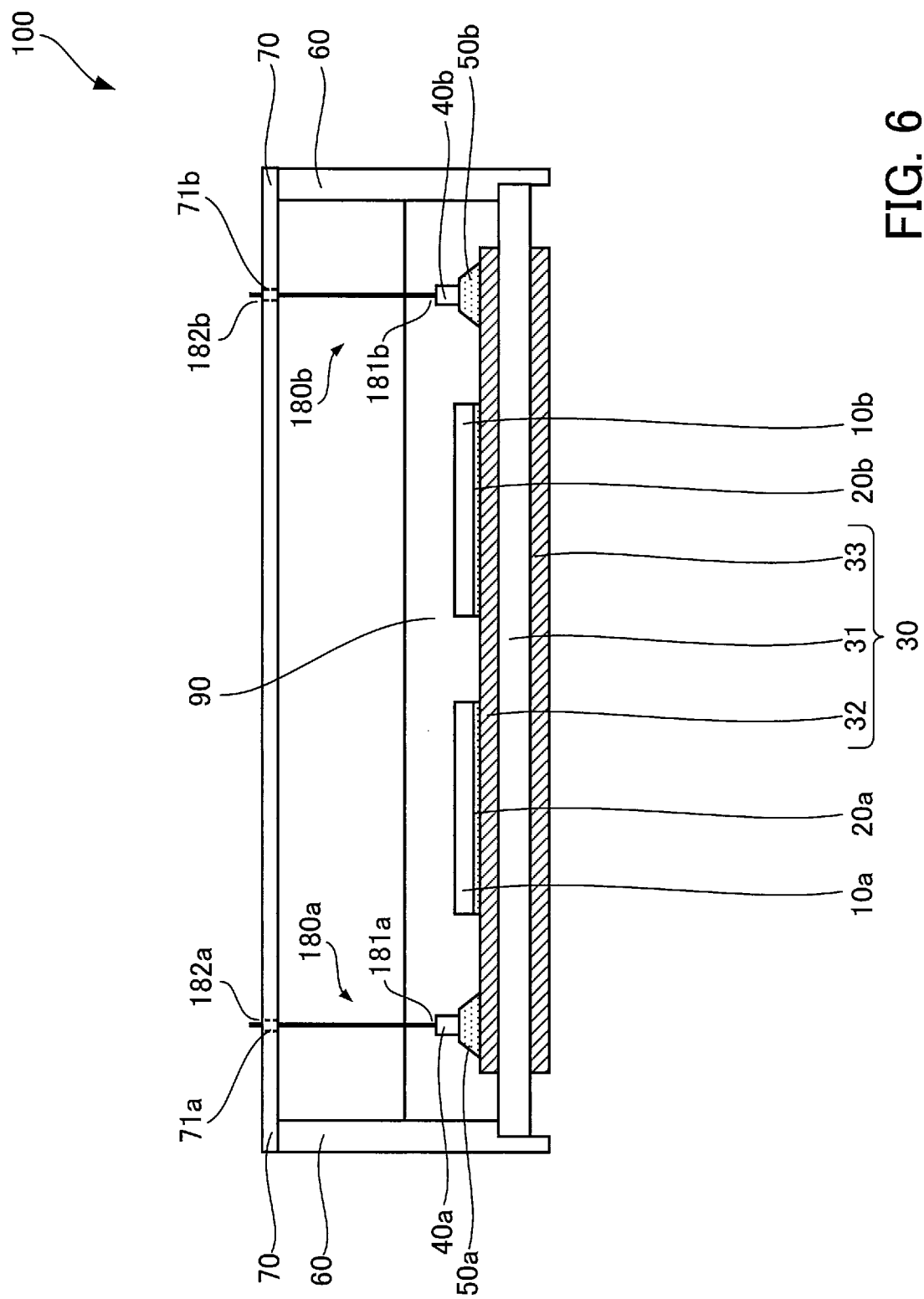
FIG. 6 illustrates a semiconductor device taken as an example for reference.

FIG. 6 illustrates a semiconductor device taken as an example for reference.

With a semiconductor device taken as an example for reference, a printed circuit board 3 and a radiation plate 4 are disposed over a semiconductor module 100. This is the same with the first embodiment. In FIG. 6, however, only the semiconductor module 100 is illustrated. Furthermore, components of the semiconductor module 100 which are the same as those of the semiconductor module 2 are marked with the same numerals.

With the semiconductor module 100 external connection terminals 180a and 180b do not include elastic portions and are straight. One end portion 181a of the external connection terminal 180a and one end portion 181b of the external connection terminal 180b are inserted into joint terminals 40a and 40b, respectively, by press-fitting. Furthermore, the other end portion 182a of the external connection terminal 180a and the other end portion 182b of the external connection terminal 180b are inserted into through holes 71a and 71b, respectively, of a case lid portion 70. A conductive layer 3b (not illustrated) of the printed circuit board 3 is disposed over the above case lid portion 70. As a result, the other end portion 182a of the external connection terminal 180a and the other end portion 182b of the external connection terminal 180b are electrically connected to the conductive layer 3b of the printed circuit board 3.

With the semiconductor device including the above semiconductor module 100, semiconductor elements 10a and 10b of the semiconductor module 100 generate heat when they are driven. The heat is conducted to a laminated substrate 30. The difference in thermal expansion coefficient among an insulating board 31, a circuit board 32, and a metal plate 33 causes an upward convex warp of the laminated substrate 30 to which the heat is conducted, and the laminated substrate 30 deforms. The deformation of the laminated substrate 30 leads to deformation of the semiconductor device. As a result, thermal stresses are applied to portions at which the external connection terminals 180a and 180b and the circuit board 32 are bonded together and portions at which the external connection terminals 180a and 180b and the printed circuit board 3 are bonded together and a bonding failure may occur. This may result in deterioration in the reliability of the semiconductor device.

On the other hand, the semiconductor device 1 includes the semiconductor elements 10a and 10b and the laminated substrate 30 including the insulating board 31 and the circuit board 32 which is formed over the front surface of the insulating board 31 and over which the semiconductor elements 10a and 10b are disposed. The semiconductor device 1 includes the surrounding case 60 which is formed over the outer peripheral portion of the insulating board 31 and which surrounds the circuit board 32 and the case lid portion 70 whose back surface is disposed over the edge portion of the opening of the surrounding case 60, which covers the circuit board 32, and in which the through holes 71a and 71b are made. Furthermore, the semiconductor device 1 includes the external connection terminals 80a and 80b. The one end portion 81a of the external connection terminal 80a and the one end portion 81b of the external connection terminal 80b are bonded to the circuit board 32. The other end portion 82a of the external connection terminal 80a and the other end portion 82b of the external connection terminal 80b enter the through holes 71a and 71b, respectively, from the back surface of the case lid portion 70 and come into contact with the front surface of the case lid portion 70. The external connection terminal 80a has the elastically deformable elastic portion 83a between the one end portion 81a and the other end portion 82a extending to the one end portion 81a side and the other end portion 82a side. The external connection terminal 80b has the elastically deformable elastic portion 83b between the one end portion 81b and the other end portion 82b extending to the one end portion 81b side and the other end portion 82b side.

With this semiconductor device 1 the external connection terminals 80a and 80b electrically connect the laminated substrate 30 and the printed circuit board 3.

In addition, with the semiconductor device 1 the other end portion 82a of the external connection terminal 80a and the other end portion 82b of the external connection terminal 80b enter the through holes 71a and 71b, respectively, from the back surface of the case lid portion 70 and come into contact with the front surface of the case lid portion 70. The case lid portion 70 is always biased to the laminated substrate 30 side by elastic force of the elastic portion 83a of the external connection terminal 80a and the elastic portion 83b of the external connection terminal 80b. Accordingly, even if the semiconductor device 1 deforms as a result of the deformation of the laminated substrate 30 to which heat generated by the semiconductor elements 10a and 10b is conducted, bonding between the one end portion 81a of the external connection terminal 80a and the one end portion 81b of the external connection terminal 80b and the joint terminals 40a and 40b, respectively, over the circuit board 32 is maintained. Similarly, bonding between the other end portion 82a of the external connection terminal 80a and the other end portion 82b of the external connection terminal 80b and the printed circuit board 3 is maintained. This prevents a bonding failure and suppresses deterioration in the reliability of the semiconductor device 1.

Second Embodiment

In a second embodiment a semiconductor device 1a in which a printed circuit board 3 is directly used in place of the case lid portion 70 of the semiconductor device 1 will be described by the use of FIG. 7.

Figure 7:
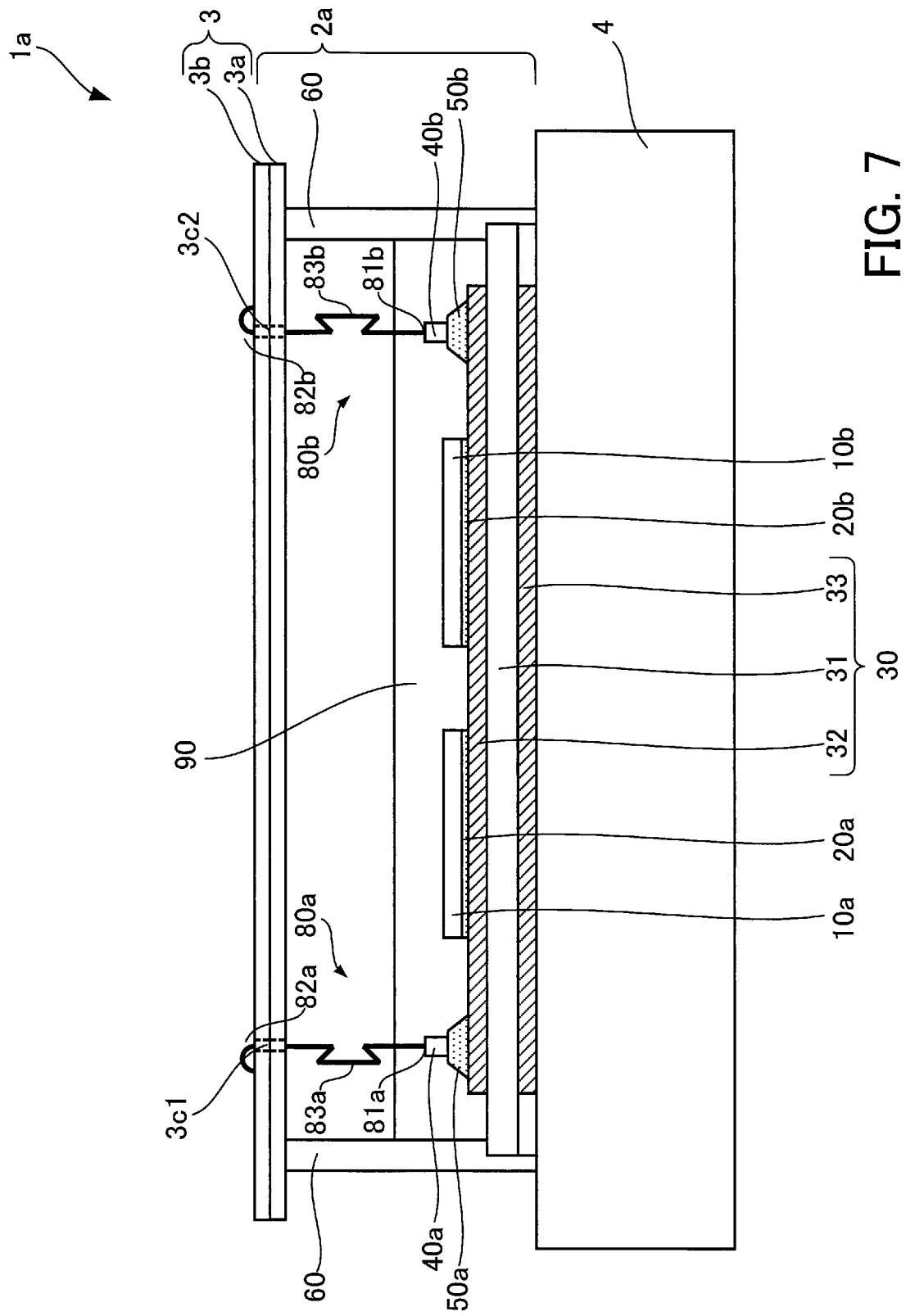
FIG. 7 illustrates a semiconductor device according to a second embodiment.

FIG. 7 illustrates the semiconductor device according to the second embodiment.

Components of the semiconductor device 1a which are the same as those of the semiconductor device 1 are marked with the same numerals.

The semiconductor device 1a includes a semiconductor module 2a including the printed circuit board 3 and a radiation plate 4 fixed to a back surface of the semiconductor module 2a.

The semiconductor module 2a includes semiconductor elements 10a and 10b, a laminated substrate 30 over which the semiconductor elements 10a and 10b are disposed with solders 20a and 20b, respectively, therebetween, and a surrounding case 60 which surrounds the semiconductor elements 10a and 10b and the laminated substrate 30. The semiconductor module 2a includes the printed circuit board 3 which is disposed over an edge portion of an opening of the surrounding case 60 and which covers the semiconductor elements 10a and 10b. Furthermore, the semiconductor module 2a includes external connection terminals 80a and 80b. One end portion 81a of the external connection terminal 80a and one end portion 81b of the external connection terminal 80b are bonded to a front surface of the laminated substrate 30 and the other end portion 82a of the external connection terminal 80a and the other end portion 82b of the external connection terminal 80b are bonded to the printed circuit board 3. With the above semiconductor module 2a sealing is performed by the use of a sealing member 90 to this side of a lower end on the one end portion 81a side of an elastic portion 83a of the external connection terminal 80a and this side of a lower end on the one end portion 81b side of an elastic portion 83b of the external connection terminal 80b in the surrounding case 60. By doing so, the semiconductor elements 10a and 10b and the laminated substrate 30 are also sealed with the sealing member 90.

The printed circuit board 3 includes an insulating layer 3a and a conductive layer 3b which is formed over a front surface of the insulating layer 3a and over which a circuit pattern for realizing determined wirings is formed. In addition, the insulating layer 3a side (back surface) of the printed circuit board 3 is disposed over an edge portion of an opening of the surrounding case 60 and the conductive layer 3b side of the printed circuit board 3 is its front surface. When this printed circuit board 3 is disposed over the surrounding case 60, through holes 3c1 and 3c2 opposed to joint terminals 40a and 40b, respectively, have been made. The printed circuit board 3 disposed over the edge portion of the opening of the surrounding case 60 is an example of a relay substrate.

As stated above, the external connection terminals 80a and 80b are formed of metal, such as copper, having good conductivity. The external connection terminal 80a has an elastically deformable elastic portion 83a between the one end portion 81a and the other end portion 82a. The external connection terminal 80b has an elastically deformable elastic portion 83b between the one end portion 81b and the other end portion 82b.

The one end portion 81a of the external connection terminal 80a and the one end portion 81b of the external connection terminal 80b are inserted by press-fitting into the joint terminals 40a and 40b disposed over determined bonding areas of a circuit board 32 with solders 50a and 50b, respectively, therebetween.

The other end portion 82a of the external connection terminal 80a and the other end portion 82b of the external connection terminal 80b enter the through holes 3c1 and 3c2, respectively, from the back surface of the printed circuit board 3, are bent, come into contact with the conductive layer 3b on the front surface side of the printed circuit board 3, and are electrically connected to the conductive layer 3b.

Furthermore, as described in the first embodiment, the external connection terminals 80a and 80b are formed of metal, such as copper, a copper alloy, aluminum, or an aluminum alloy. A copper alloy is phosphor bronze, nickel silver, beryllium copper, a copper-titanium alloy, a copper-nickel alloy, or the like. It is desirable to use as a copper alloy a copper-nickel alloy which is superior especially in tensile strength and electrical conductivity. Furthermore, in order to improve corrosion resistance and electrical properties, a nickel plating film, a gold plating film, a silver plating film, or a tin plating film may be formed as an external coating. Moreover, these plating films may be laminated. If the conductivity of a material for the external connection terminals 80a and 80b which are not external coatings is higher than that of a material for an external coating, then it is desirable that the thickness of an external coating of a tip portion of each of the other end portion 82a of the external connection terminal 80a and the other end portion 82b of the external connection terminal 80b be 0.5 μm or more and 10 μm or less, more preferably 3 μm or more and 5 μm or less. If the thickness of an external coating of a tip portion of each of the other end portion 82a of the external connection terminal 80a and the other end portion 82b of the external connection terminal 80b is in this range, then a material for the external coating is removed by heat at the time of energization. As a result, electrical connection between the tip portion of each of the other end portion 82a of the external connection terminal 80a and the other end portion 82b of the external connection terminal 80b and the conductive layer 3b of the printed circuit board 3 becomes good. To be concrete, this applies to a case where the external connection terminals 80a and 80b are formed of copper or a copper alloy and where a nickel plating film, a tin plating film, or the like is formed as an external coating. The tip portion is a portion which is in contact with the conductive layer 3b of the printed circuit board 3.

In order to fabricate the semiconductor device 1a, the surrounding case 60 is put over an outer peripheral portion of an insulating board 31 of the laminated substrate over which the semiconductor elements 10a and 10b, the joint terminals 40a and 40b, and the external connection terminals 80a and 80b are disposed with an adhesive (not illustrated) therebetween (see FIG. 3). This is the same with the first embodiment.

In FIG. 4, the other end portion 82a of the external connection terminal 80a and the other end portion 82b of the external connection terminal 80b are inserted not into the through holes in the case lid portion 70 but into the through holes 3c1 and 3c2, respectively, in the printed circuit board 3 to dispose the printed circuit board 3 over the edge portion of the opening of the surrounding case 60 with an adhesive (not illustrated) therebetween. At this time the insulating layer 3a side (back surface) of the printed circuit board 3 is disposed over the edge portion of the opening of the surrounding case 60.

The other end portion 82a of the external connection terminal 80a and the other end portion 82b of the external connection terminal 80b inserted into the through holes 3c1 and 3c2, respectively, in the printed circuit board 3 are pulled upward. This is the same with the first embodiment.

In a state in which the other end portion 82a of the external connection terminal 80a and the other end portion 82b of the external connection terminal 80b are pulled up, the other end portion 82a and the other end portion 82b are then bent to the conductive layer 3b on the front surface side of the printed circuit board 3 so as to be hook-shaped and in contact with the conductive layer 3b of the printed circuit board 3 (see FIG. 7). As a result, the elastic portions 83a and 83b of the external connection terminals 80a and 80b, respectively, are kept in an expanded state. Therefore, the printed circuit board 3 is pressed downward in FIG. 7 by the other end portion 82a of the external connection terminal 80a and the other end portion 82b of the external connection terminal 80b.

As a result, the semiconductor module 2a is formed.

A radiation plate 4 is then disposed over a metal plate 33 of the laminated substrate 30 of the semiconductor module 2a with a solder (not illustrated) therebetween.

The semiconductor device 1a illustrated in FIG. 7 is obtained by the above process.

With this semiconductor device 1a the external connection terminals 80a and 80b electrically connect the laminated substrate 30 and the printed circuit board 3. This is the same with the semiconductor device 1 according to the first embodiment.

In addition, with the semiconductor device 1a the other end portion 82a of the external connection terminal 80a and the other end portion 82b of the external connection terminal 80b are in contact with the front surface of the printed circuit board 3. The printed circuit board 3 is always biased to the laminated substrate 30 side by elastic force of the elastic portion 83a of the external connection terminal 80a and the elastic portion 83b of the external connection terminal 80b. Accordingly, even if the semiconductor device 1a deforms as a result of the deformation of the laminated substrate 30 to which heat generated by the semiconductor elements 10a and 10b is conducted, bonding between the one end portion 81a of the external connection terminal 80a and the one end portion 81b of the external connection terminal 80b and the joint terminals 40a and 40b, respectively, over the circuit board 32 is maintained. Similarly, bonding between the other end portion 82a of the external connection terminal 80a and the other end portion 82b of the external connection terminal 80b and the printed circuit board 3 is maintained. This prevents a bonding failure and suppresses deterioration in the reliability of the semiconductor device 1a.

Furthermore, with the semiconductor device 1a the case lid portion 70 used in the semiconductor device 1 according to the first embodiment is not used. This reduces the number of parts and therefore manufacturing costs.

According to the disclosed technique, deterioration in the reliability of a semiconductor device is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a semiconductor element;
   a laminated substrate including
      an insulating board having a front surface, and
      a circuit board disposed on the front surface other than an outer peripheral portion of the insulating board, the circuit board having a front surface on which the semiconductor element is mounted;
   a surrounding case having an opening, and being disposed on the outer peripheral portion of the insulating board to surround the circuit board;
   a relay substrate having a front surface and a rear surface, and a through hole passing through from the rear surface to the front surface, the relay substrate being disposed on the surrounding case to cover the opening of the surrounding case, the relay substrate being disposed outside the surrounding case; and
   an external connection terminal connecting the laminated substrate to the relay substrate, and including
      a first end portion bonded to the circuit board,
      a second end portion, opposite to the first end portion, inserted into the through hole of the relay substrate from the rear surface of the relay substrate so as to be in contact with the front surface of the relay substrate, and
      an elastically deformable elastic portion between the first end portion and the second end portion, the elastic portion extending between the first end portion and the second end portion.

2. The semiconductor device according to claim 1, wherein:
   the circuit board has a bonding area to which the first end portion of the external connection terminal is bonded, and
   the bonding area of the circuit board is opposite to a position of the through hole of the relay substrate.

3. The semiconductor device according to claim 2, further comprising:
   a bonding material, and
   a joint terminal bonded to the bonding area of the circuit board using the bonding material, the first end portion of the external connection terminal being connected to the joint terminal.

4. The semiconductor device according to claim 3, wherein:
   the joint terminal has a cylindrical shape; and
   the first end portion of the external connection terminal is press-fitted into the joint terminal.

5. The semiconductor device according to claim 1, wherein the second end portion of the external connection terminal
is inserted into the through hole of the relay substrate,
is bent to the front surface of the relay substrate so as to be hook-shaped, and
is in contact with the front surface of the relay substrate.

6. The semiconductor device according to claim 1, further comprising a sealing member sealing an inside of the surrounding case.

7. The semiconductor device according to claim 6, wherein the sealing member fills the inside of the surrounding case from the front surface of the circuit board to a lower portion of the elastic portion, the sealing member being free of contact with an upper portion of the elastic portion.

8. The semiconductor device according to claim 7, wherein the sealing member is comprised of a heat-hardening resin.

9. The semiconductor device according to claim 1, wherein the elastic portion has an elastic modulus in a range of 2000 N/m$^2$ to 6000 N/m$^2$.

10. The semiconductor device according to claim 1, wherein the elastic portion has an elastic modulus in a range of 3000 N/m$^2$ to 5000 N/m$^2$.

11. The semiconductor device according to claim 1, further including:
a printed circuit board having a principal surface and a conductive layer on the principal surface, the printed circuit board being disposed on the relay substrate, the conductive layer of the printed circuit board contacting the relay substrate, wherein
the conductive layer of the printed circuit board and the second end portion of the external connection terminal are electrically connected.

12. The semiconductor device according to claim 1, wherein:
the relay substrate includes a conductive layer disposed on the front surface of the relay substrate; and
the second end portion of the external connection terminal is in contact with and is electrically connected to the conductive layer of the relay substrate.

13. The semiconductor device according to claim 1, wherein the elastic portion is comprised of elastically deformable elastic material to continuously pull the relay substrate toward the laminated substrate.

14. The semiconductor device according to claim 1, wherein the relay substrate is disposed on the surrounding case to cover an entire area of the opening of the surrounding case.

* * * * *